US009224491B1

(12) United States Patent
Somaiya

(10) Patent No.: US 9,224,491 B1
(45) Date of Patent: Dec. 29, 2015

(54) AVERAGE VOLTAGE BAND DETECTION AND USE FOR TUNING OF VOLTAGES IN ASICS

(71) Applicant: SanDisk Technologies Inc., Plano, TX (US)

(72) Inventor: Vikram Somaiya, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/586,502

(22) Filed: Dec. 30, 2014

(51) Int. Cl.
*G11C 16/30* (2006.01)
*G11C 16/26* (2006.01)
*H01L 27/115* (2006.01)
*G05F 1/565* (2006.01)

(52) U.S. Cl.
CPC ........... *G11C 16/30* (2013.01); *G05F 1/565* (2013.01); *G11C 16/26* (2013.01); *H01L 27/11582* (2013.01)

(58) Field of Classification Search
CPC .. G11C 16/26; G11C 16/30; H01L 27/11582; G05F 1/565
See application file for complete search history.

(56) References Cited

U.S. PATENT DOCUMENTS

| | | | | |
|---|---|---|---|---|
| 5,563,779 | A * | 10/1996 | Cave et al. | H02M 3/07 320/166 |
| 6,891,764 | B2 * | 5/2005 | Li | G11C 16/12 327/536 |
| 8,437,169 | B2 * | 5/2013 | Xia et al. | G11C 11/22 365/145 |
| 9,128,501 | B2 * | 9/2015 | Tan et al. | G05F 3/16 |
| 2007/0284609 | A1 * | 12/2007 | Ang et al. | G11C 5/145 257/139 |

* cited by examiner

*Primary Examiner* — Harry W Byrne
*Assistant Examiner* — Lance Reidlinger
(74) *Attorney, Agent, or Firm* — Davis Wright Tremaine LLP

(57) ABSTRACT

The timing and power consumption of controller circuits are is dependent on Process, Voltage, and Temperature. If the controller ASIC can measure the average voltage level during run-time, then firmware can use this information to tune the voltages for optimal speed/power performance. A voltage detector generates an output of, for example, 3 bits, where each state of the three bit bus represents a voltage band. These bits can then be used by the firmware to trim the appropriate regulators to boost/lower the voltages. This can be done for both the core voltage and I/O voltages. The firmware can be further optimized to take into account the states of temperature detectors and process detectors along with voltage band detector to optimize the system performance.

24 Claims, 11 Drawing Sheets

Programming into four states represented by a 2-bit code

AVERAGE VOLTAGE BAND DETECTION AND USE FOR TUNING OF VOLTAGES IN ASICS

BACKGROUND

This application relates to techniques of determining and tuning the core operating voltage on integrated circuits, such as non-volatile memory controllers.

Controller circuits for non-volatile memory devices frequently have a voltage regulator. The voltage level of the regulator is dependent on the process. During wafer sort, each voltage regulator on every die is tested for appropriate voltage levels and the regulators are trimmed to provide the required voltage levels. The trimmed values can then be stored in a one-time programmable memory on the circuit. Next time, when the die is powered up, the values stored in the one-time programmable memory are read and voltage levels of the regulators are boosted up/lowered down to the expected level. The above procedure can also be repeated for other regulators on the ASIC.

Although this technique can be used to tune the controller's operating voltages, it requires a trimming process and the trim values need to be stored in a one-time program, using valuable circuit area. Further, although the trimming may be accurate when set, over time or variations in operating conditions the accuracy may not be so good.

SUMMARY

A controller integrated circuit for a non-volatile memory system includes a voltage regulator connectable, a voltage detector, and a core processing section. The voltage regulator is connectable to a power supply to generate a regulated voltage and supply this to a first section of the controller circuit, where the voltage regulator adjusts the level of the regulated voltage in response to a control signal. The voltage detector is connected to receive a reference voltage and an internal voltage level from the first section of the controller circuit and determine within which of a plurality of voltage ranges an average of the internal voltage level of the first section falls while in operation and the to generate from it a first signal indicative of its level. The core processing section includes logic circuitry connected to supply the control signal to the voltage regulator and connected to receive the first signal and in response to this first signal trim the value of the control signal.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
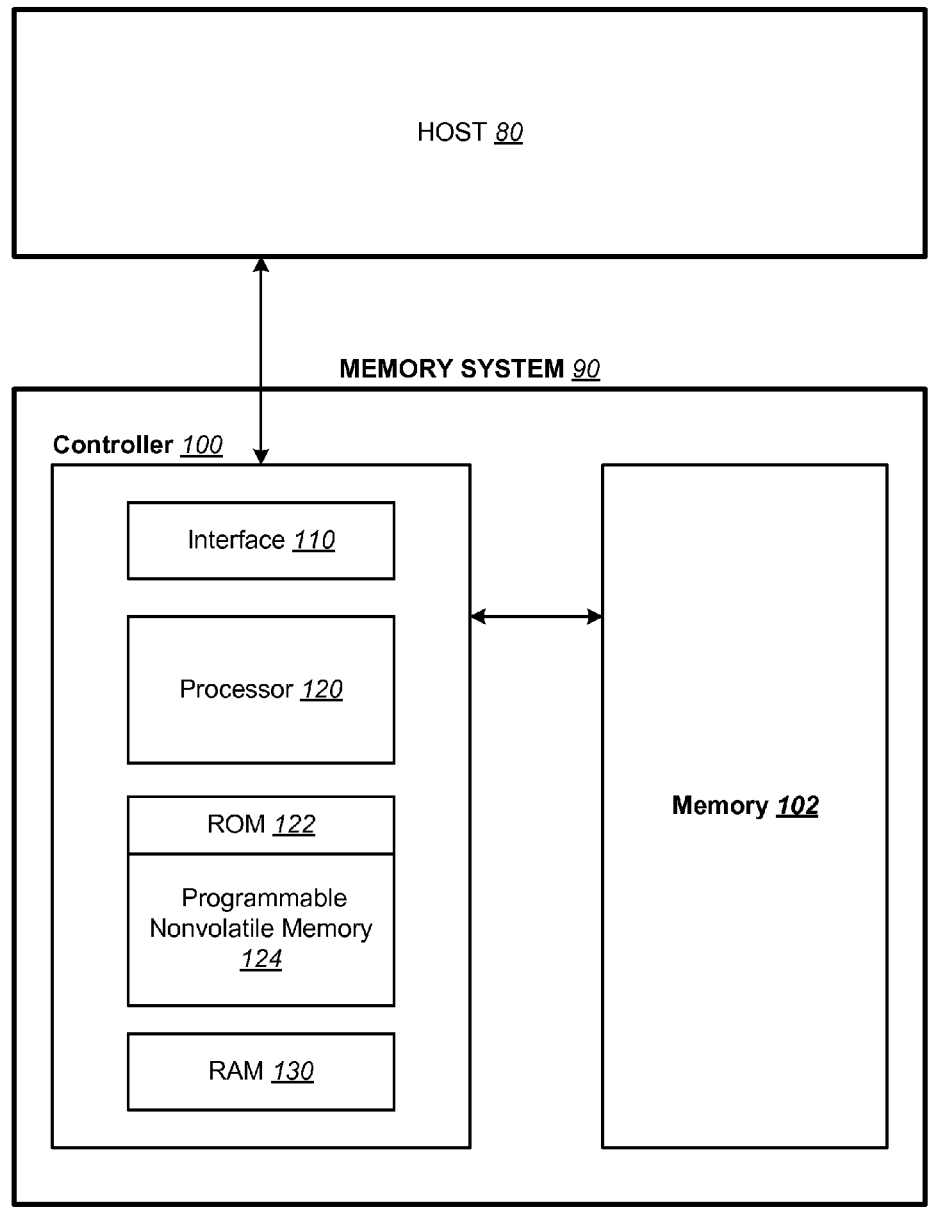
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. For example, the memory system may be in the form of a removable memory such as a memory card, an embedded memory system or a solid state drive (SSD). The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein.

Physical Memory Structure

Figure 2:
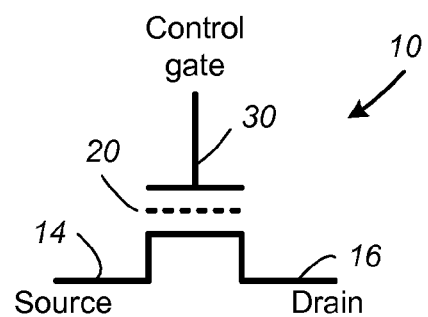
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
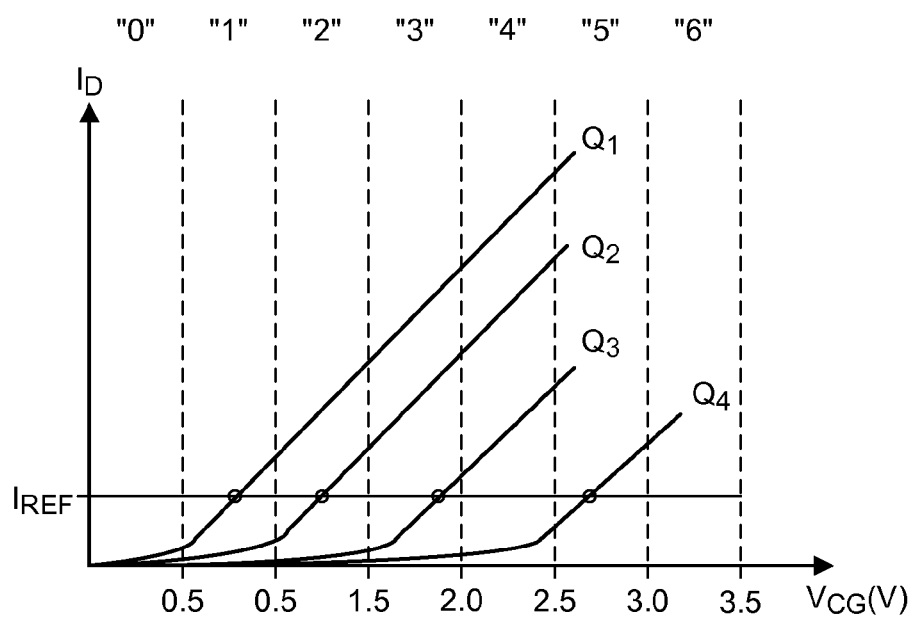
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
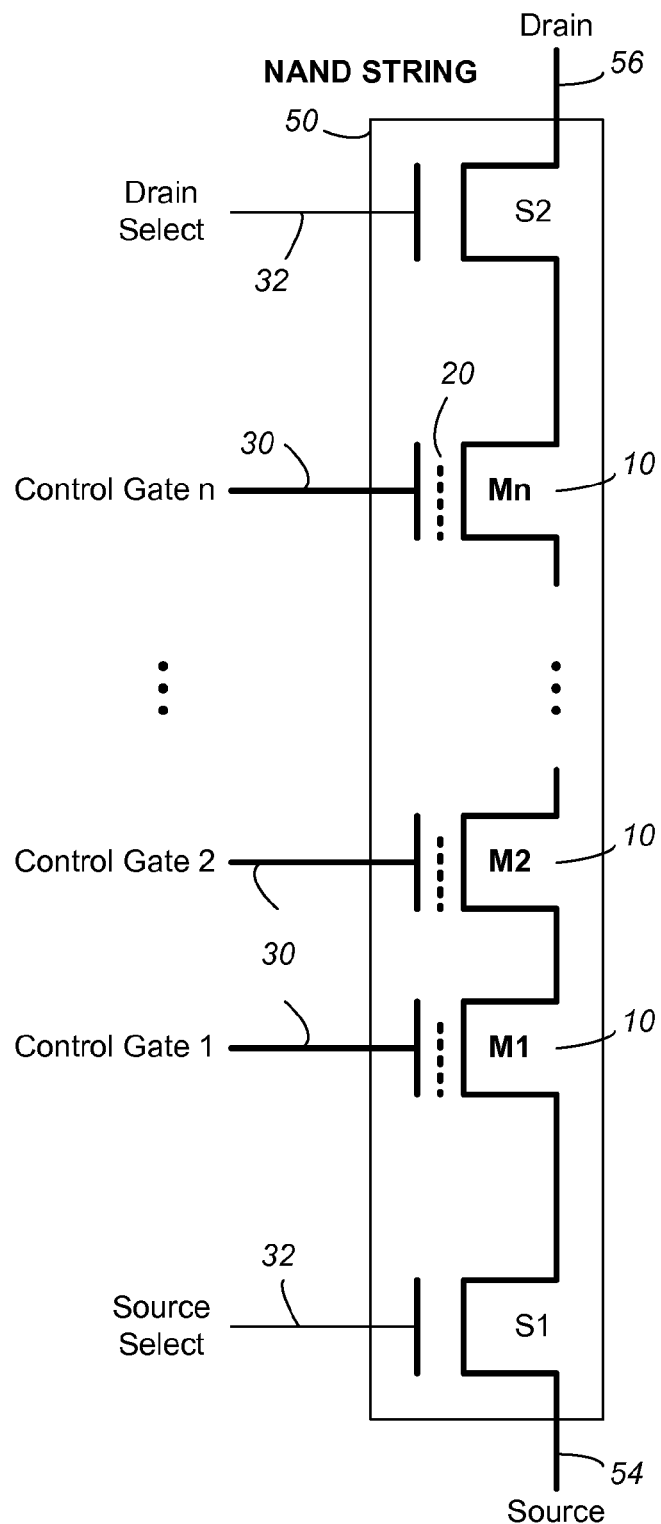
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
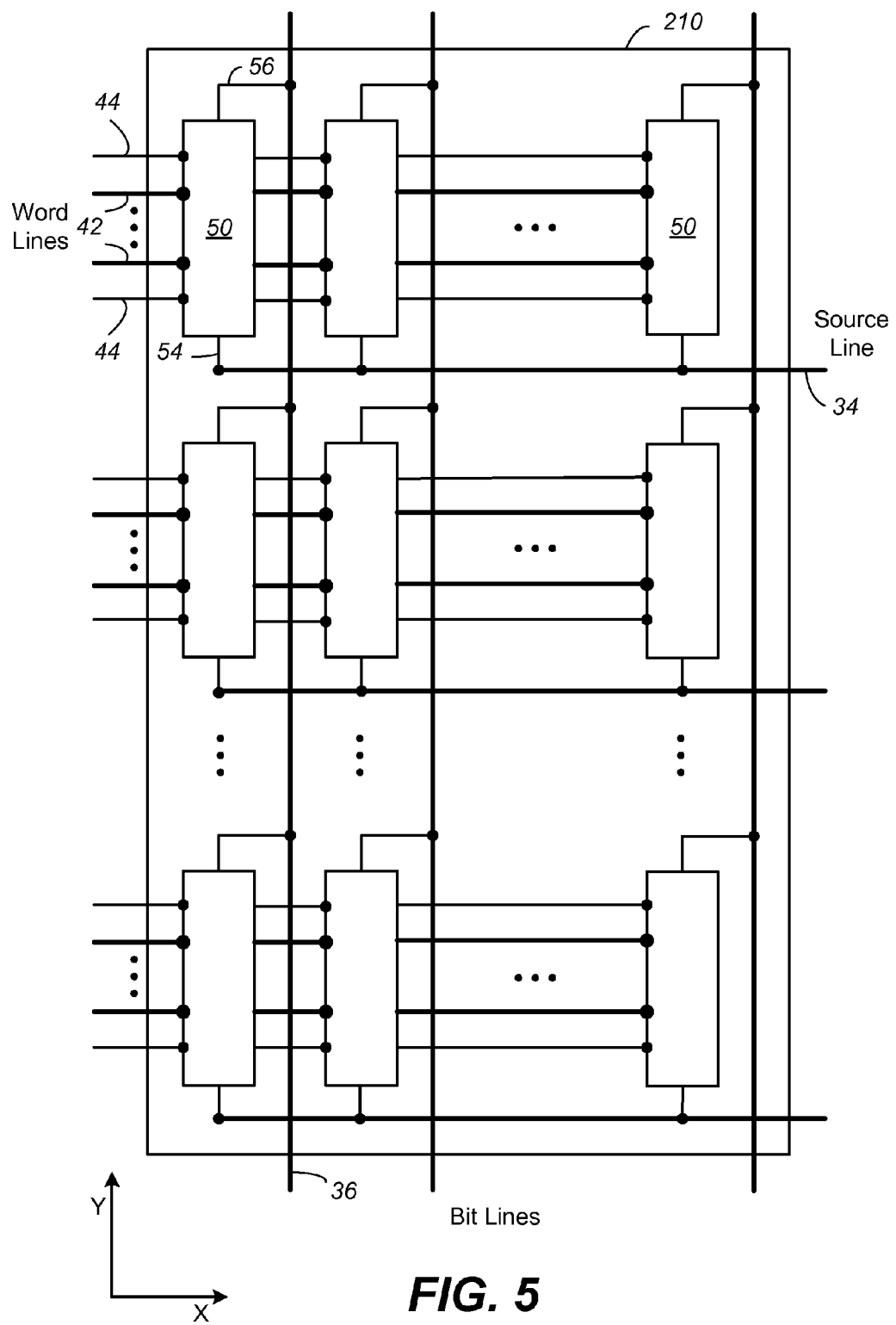
FIG. 5 illustrates an example of a NAND array 210 of memory cells, constituted from NAND strings 50 such as that shown in FIG. 4.
Figure 6:
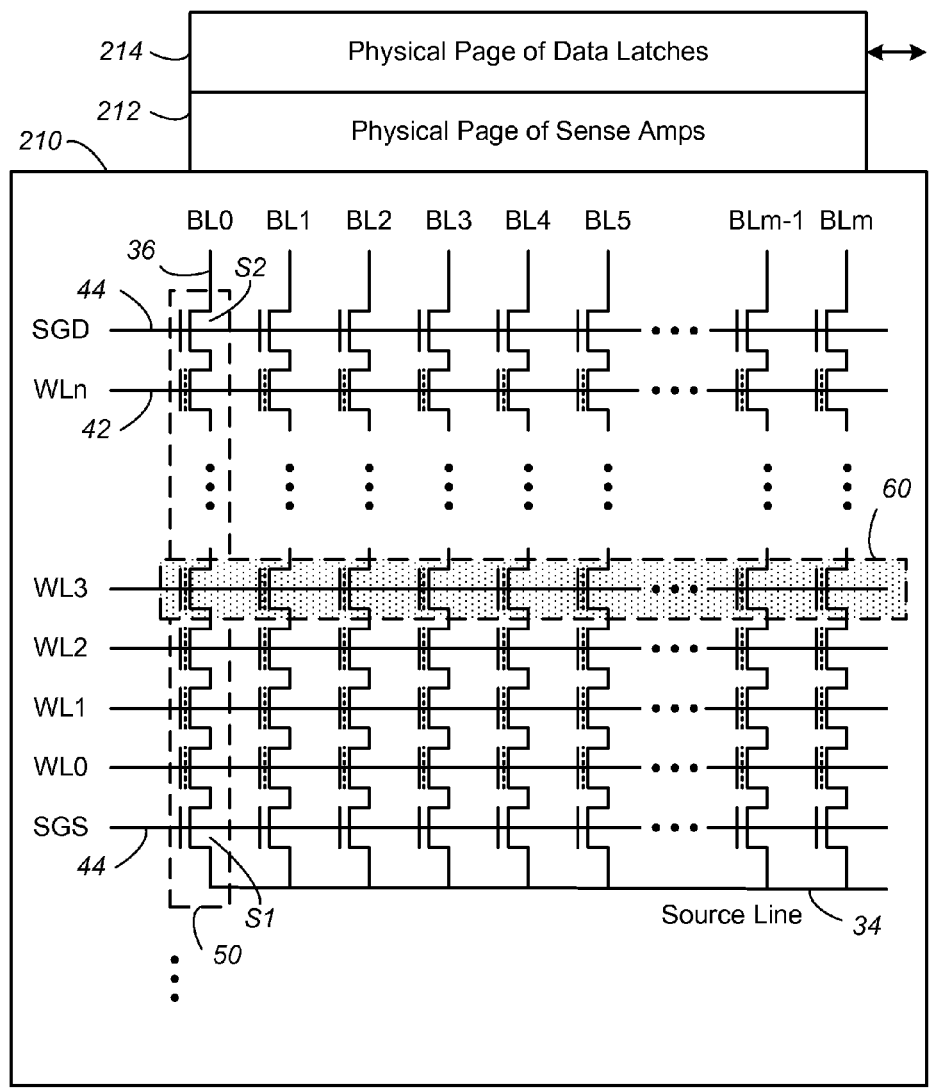
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
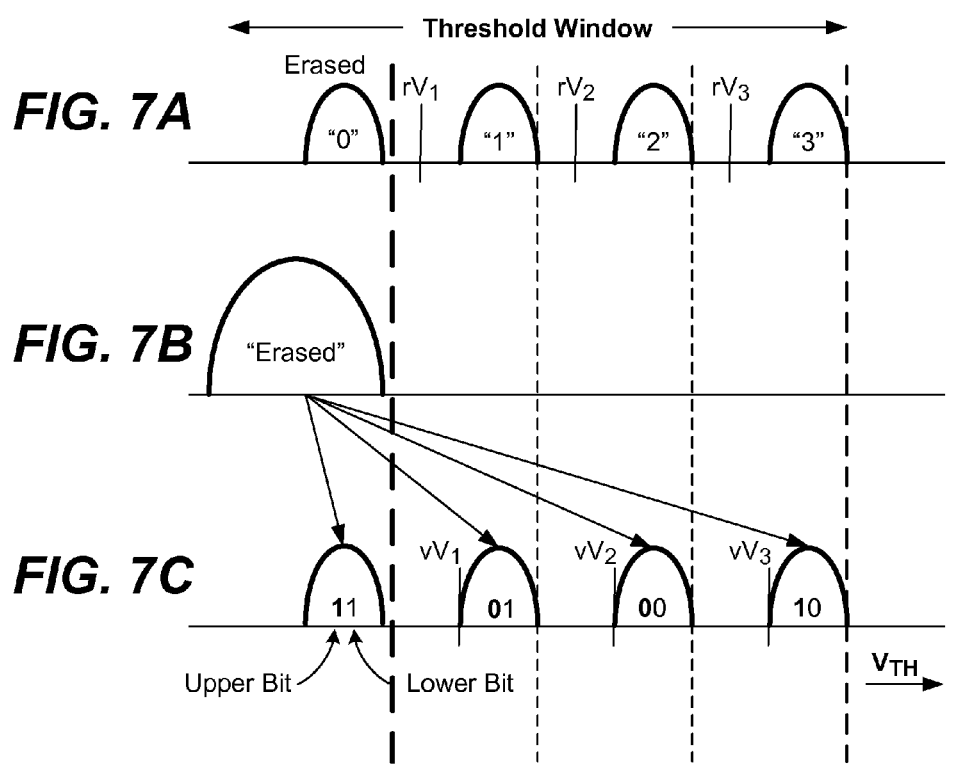
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
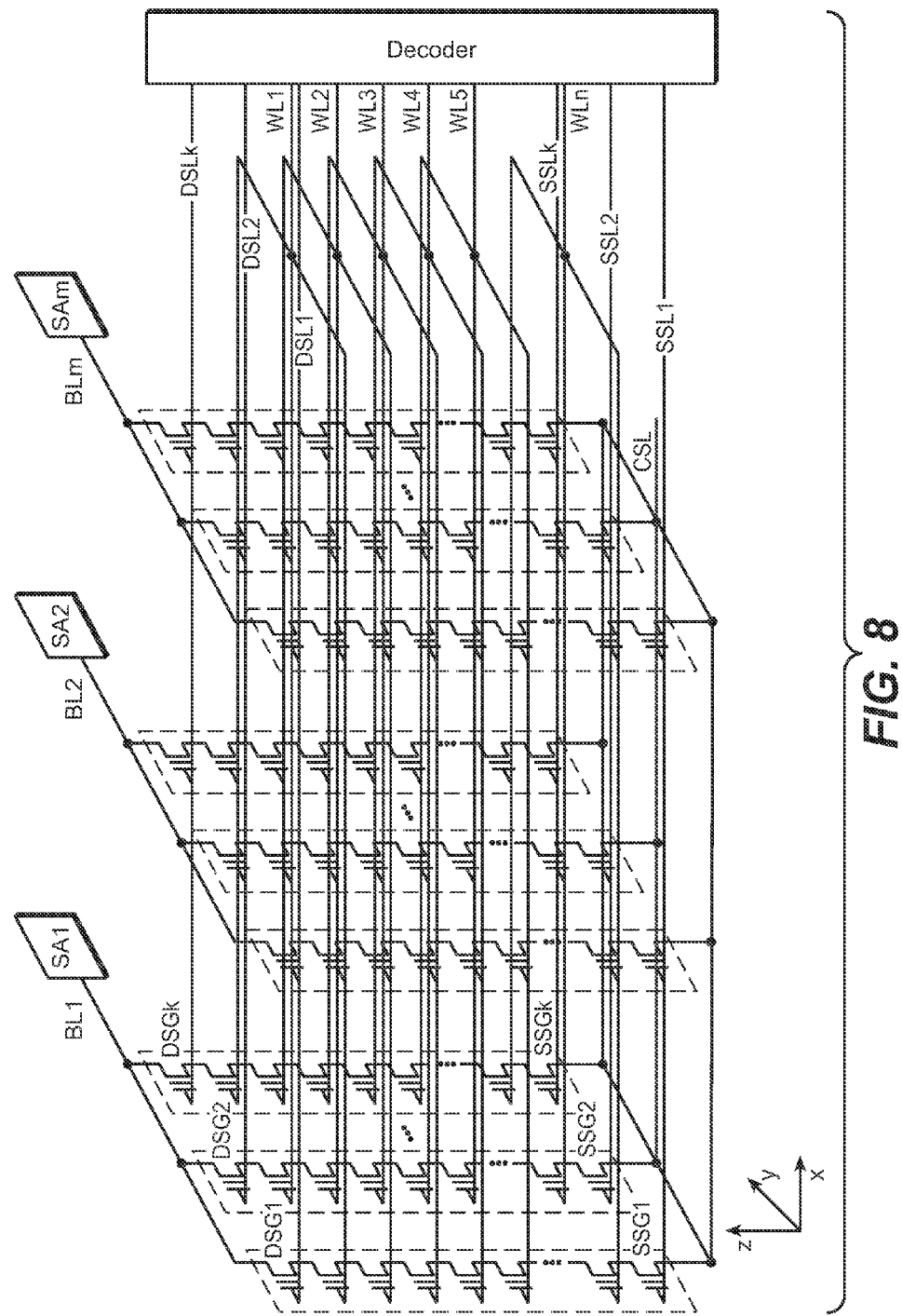
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
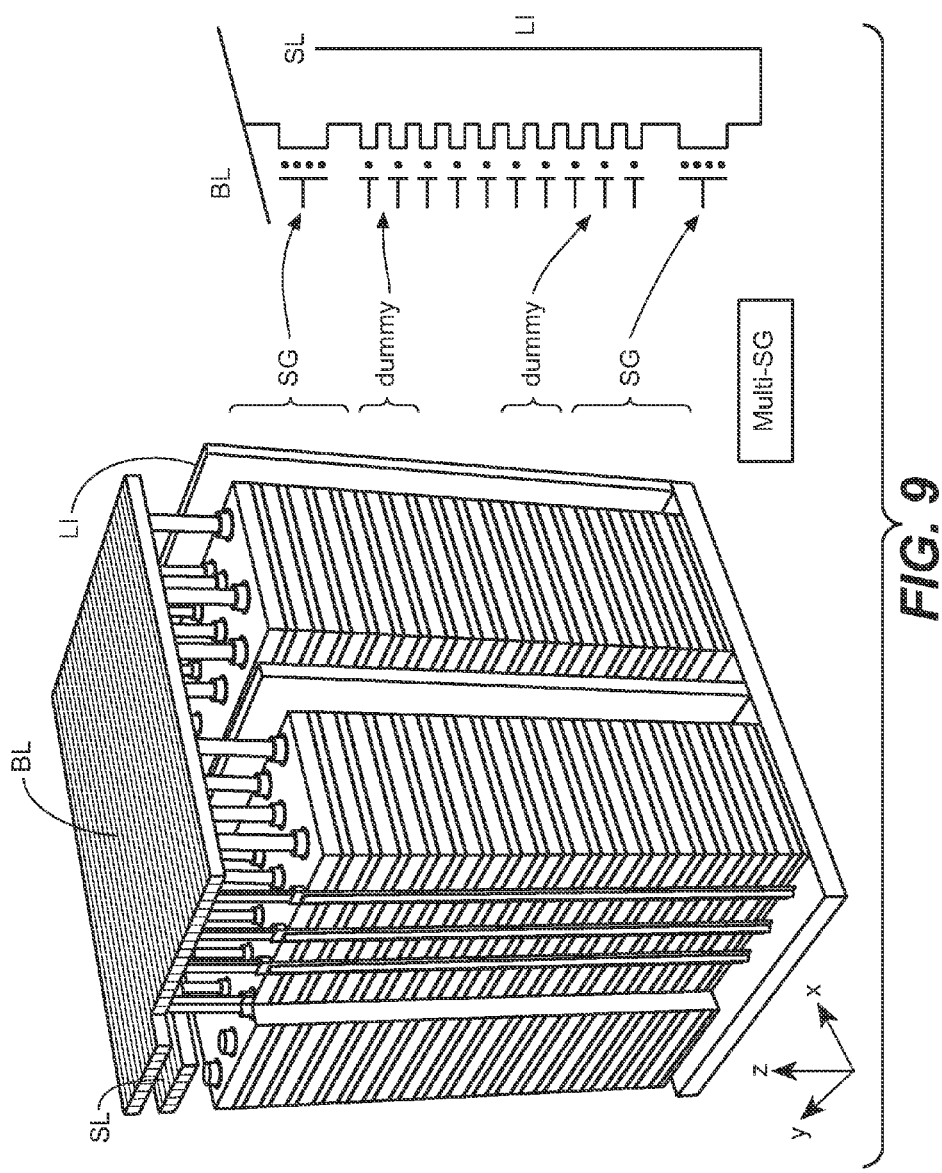
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
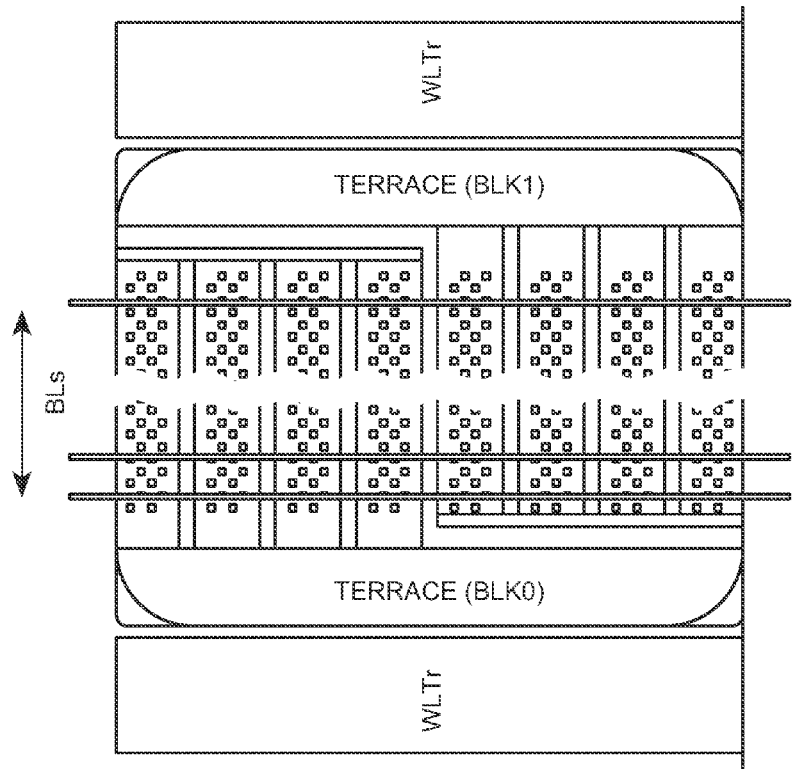

FIG. 10 shows a top view of the structure for two blocks in the exemplary embodiment. Two blocks (BLK0 above, BLKI below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
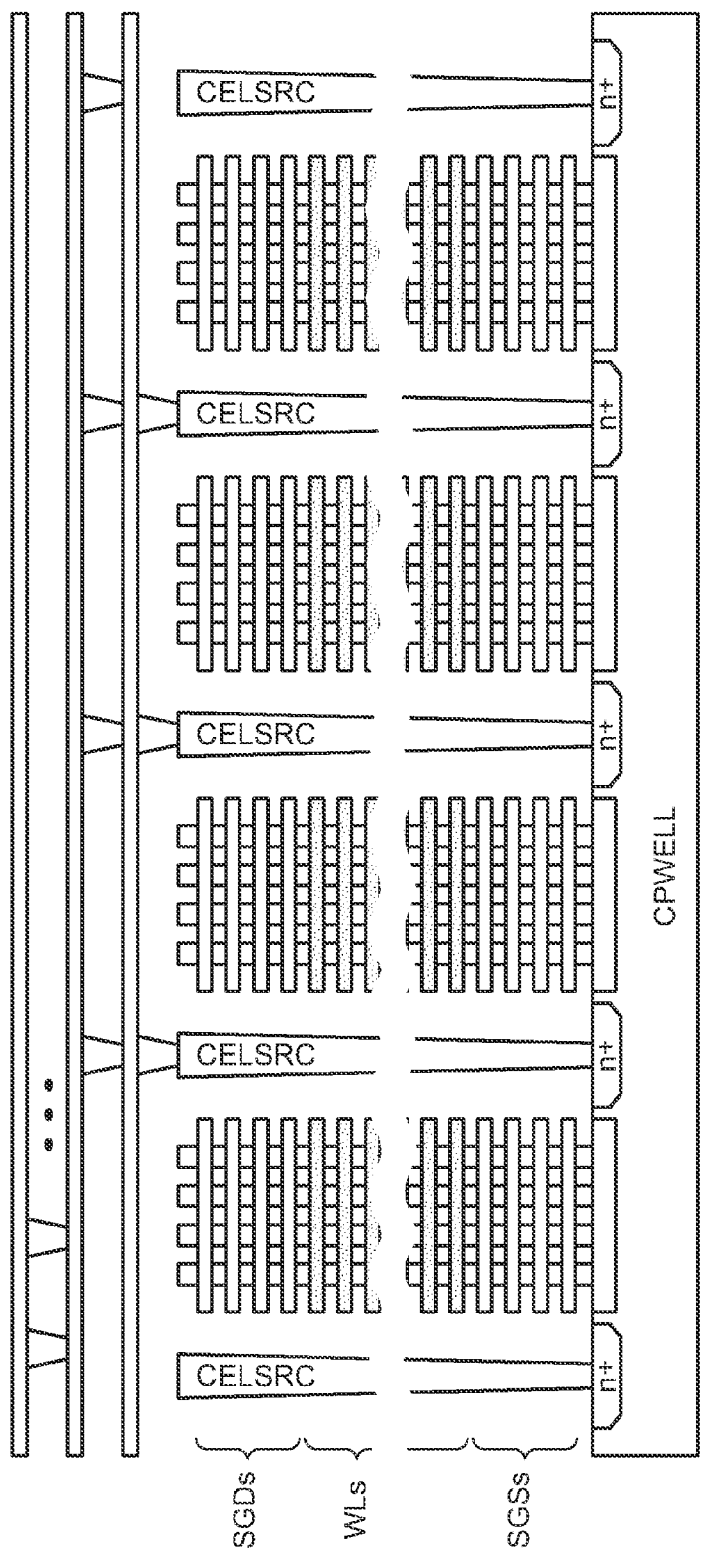

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
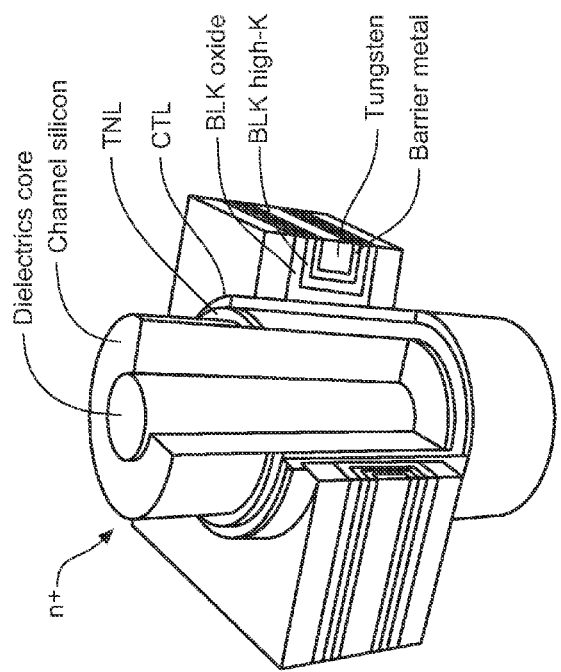

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Average Voltage Band Detection and Applications

This section looks further at the controller circuit (100, FIG. 1) of the memory system. More specifically, it considers techniques to provide ASIC controllers with the ability to monitor voltages inside the core and use firmware to better manage power and speed requirements. As noted in the Background, often have one on or more voltage regulators (core regulators, flash/host pad regulators, conventional and other mode regulators), all of which need to be trimmed and have the corresponding set of values stored on the circuit. The techniques described below remove the need for one-time programmable memory for storing corresponding trim values, saving on costs. Although discussed here in the context of a memory controller, these techniques are applicable in a more general ASIC context.

The timing and power consumption of memory controllers ASICs is dependent on process, voltage, and temperature (PVT) variations. Process and temperature can be measured inside ASIC and corrective actions can be taken. At present, the ASIC controllers lack the capability of measuring the average voltage level for core and I/O voltages during run-time. The capability exists, but only on test bench. In packaged parts controllers have no way of monitoring voltages.

By allowing the controller to the average voltage level during run-time, then the controller's firmware can use this information to tune the voltages for optimal speed/power performance. A voltage detector which generates a signal based on this average voltage level during run-time. The exemplary embodiment uses a digital signal of three or more bits, where each of these bits can represent a "voltage band" of say 10 mV or so. The large the range to cover, the finer the granularity desired, or both, the greater the number of bits that can be used. These bits can be tied to a set of read only registers. The controller's firmware can be programmed to read these registers and decode the voltage levels. Then it can trim the appropriate regulators to boost/lower the voltages.

Figure 13:
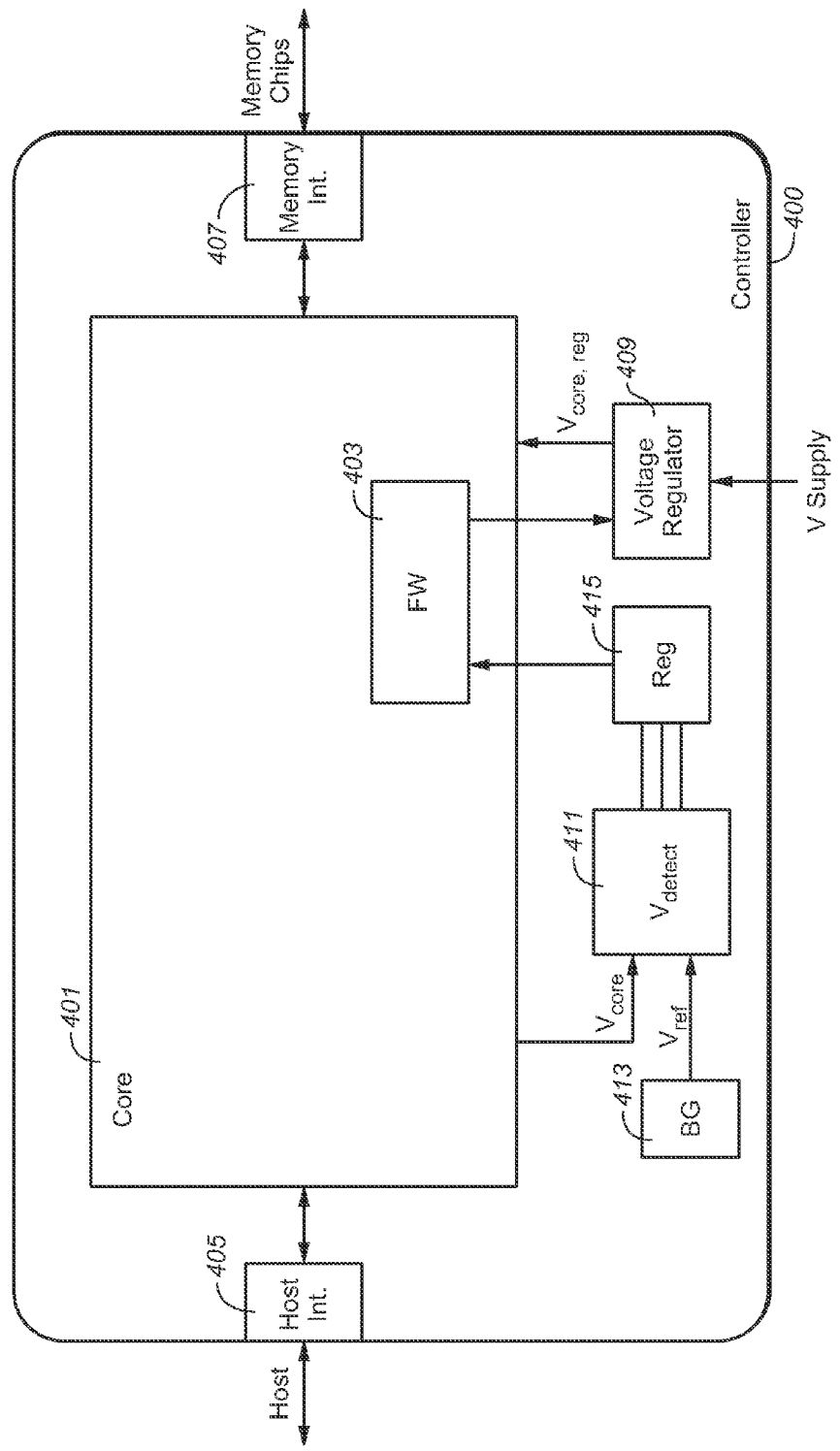
FIG. 13 is a simplified box diagram of a controller illustrating aspects of an exemplary embodiment.

FIG. 13 is a simplified representation of some elements for an exemplary embodiment, where only some of the elements relevant to the present discussion are explicitly shown. A controller circuit 400 for a memory system (such as a memory card, solid state drive, etc.) has a host interface 405, a memory interface 407, and a core section 401. Within the core is separated out the logic circuitry 403 executing firmware (FW), where this is separately represented for purposes of this discussion, although more generally the described functions can be executed by some combination of hardware, software, and firmware with the controller core. A voltage regulator 409 provides a regulated voltage $V_{core, reg}$ to the core for use in its operation. The regulator generates this operating voltage from the voltage supply level based on a controller signal from the firmware 403. The voltage inside the core, $V_{core}$, is monitored a voltage detector circuit 411 that compares the average of this internal operating voltage with a reference level $V_{ref}$ such as can be provided by a bandgap circuit 413. Based on the comparison, the voltage detector 411 generates a 3-bit, in this example, signal that can be set in the registers 415, from which the firmware can read the values and trim the regulator's outputs accordingly. Although shown here for the core, a similar arrangement can be used for the I/O voltages in the host interface, memory interface, or both.

The firmware can be further optimized to take into account the states of temperature detectors and process detectors (not shown in FIG. 13) along with voltage band detector to optimize the system performance. For example, a process detector would be a ring oscillator, where the oscillator frequency will change based on a given process. During hardware characterization, the ring-oscillator frequency can be characterized using oscilloscopes for different process and this information can be used as reference by firmware to identify the process.

This arrangement has a number of useful features. As the voltage regulation is trimmed based upon the voltage detector determination, there is not the need to save the trim parameters in a one-time programmable or fuse-type memory, saving on area and, consequently, costs. It can also provide input/output timing improvements, since if the I/O voltages can be measured, then the firmware can raise or lower them to optimize the system for speed/power performance at run time. The arrangement can also provide leakage optimization, as leakage current is dependent on the voltage. During standby mode, further leakage optimization can be achieved by lowering the core-regulator voltage. Since voltage detector will provide average voltage levels, system will always be in control to not drop the voltage below tolerable limit. Further, such a self-adjusting mechanism for core and I/O voltages and will help in mitigation of failures because of incorrect voltage levels.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A controller integrated circuit for a non-volatile memory system, comprising:

a voltage regulator connectable to a power supply to generate and supply therefrom a first regulated voltage to a first section of the controller circuit, wherein the voltage regulator adjusts the level of the first regulated voltage in response to a control signal;

a voltage detector connected to receive a reference voltage and an internal voltage level from the first section of the controller circuit and determine within which of a plurality of voltage ranges an average of the internal voltage level of the first section falls while in operation and generate therefrom a first signal indicative thereof; and a core processing section including logic circuitry connected to supply the control signal to the voltage regulator and connected to receive the first signal and in response thereto trim the value of the control signal.

2. The controller integrated circuit of claim 1, wherein the first section is the core processing section.

3. The controller integrated circuit of claim 1, further comprising:
a memory interface circuit, wherein the first section is the memory interface circuit.

4. The controller integrated circuit of claim 1, further comprising:
a host interface circuit, wherein the first section is the host interface circuit.

5. The controller integrated circuit of claim 1, wherein the reference voltage is provided by a band gap circuit formed on the controller integrated circuit.

6. The controller integrated circuit of claim 1, wherein the first signal is a multi-bit digital signal.

7. The controller integrated circuit of claim 6, further comprising:
a set of registers connected to the voltage detector to receive and store the first signal and connected to the logic circuitry, where the logic circuitry receives the first signal by reading the registers.

8. The controller integrated circuit of claim 6, wherein the first signal is of three or bits.

9. The controller integrated circuit of claim 1, further comprising:
a temperature detector circuit to generate a second signal that is indicative of a temperature of the controller integrated circuit, wherein the logic circuitry is connected to receive the second signal further trims the value of the control signal in response thereto.

10. The controller integrated circuit of claim 1, further comprising:
a process detector circuit to generate a second signal that is indicative of process variations within the controller integrated circuit, wherein the logic circuitry is connected to receive the second signal further trims the value of the control signal in response thereto.

11. The controller integrated circuit of claim 10, wherein process detector circuit includes a ring oscillator circuit.

12. The controller integrated circuit of claim 1, wherein the controller integrated circuit is part of a non-volatile memory system further including a memory circuit, wherein the memory circuit is a monolithic three-dimensional semiconductor memory device where the memory cells are arranged in multiple physical levels above a silicon substrate and comprise a charge storage medium and the bit lines run in a horizontal direction relative to the substrate.

13. A method of operating a controller integrated circuit for a non-volatile memory system, comprising:
generating a first regulated voltage by a voltage regulator from a power supply connected thereto, wherein the voltage regulator adjusts the level of the first regulated voltage in response to a control signal;
supplying the first regulated voltage from the voltage regulator to a section of the controller circuit;
receiving at a voltage detector of a reference voltage and an internal voltage level from the first section of the controller circuit;
performing a determination by the voltage detector of within which of a plurality of voltage ranges an average of the internal voltage level of the first section falls while in operation;
generating by the voltage detector from the determination of a first signal indicative thereof;
receiving the first signal at a core processing section including logic circuitry; and
supplying of the control signal to the voltage regulator from core processing section, where the core processing section trims the value of the control signal in response to the first signal.

14. The method of claim 13, wherein the first section is the core processing section.

15. The method of claim 13, wherein the first section is a memory interface circuit.

16. The method of claim 13, wherein the first section is a host interface circuit.

17. The method of claim 13, wherein the reference voltage is provided by a band gap circuit formed on the controller integrated circuit.

18. The method of claim 13, wherein the first signal is a multi-bit digital signal.

19. The method of claim 18, wherein the controller integrated circuit includes a set of registers connected to the voltage detector to receive and store the first signal and connected to the logic circuitry, where the logic circuitry receives the first signal by reading the registers.

20. The method of claim 18, wherein the first signal is of three or bits.

21. The method of claim 13, wherein the controller integrated circuit includes a temperature detector circuit, the method further including:
generating by the controller integrated circuit of a second signal that is indicative of a temperature of the controller integrated circuit, wherein the logic circuitry is connected to receive the second signal further trims the value of the control signal in response thereto.

22. The method of claim 13, wherein the controller integrated circuit includes a process detector circuit, the method further including:
generating by the process detector circuit of a second signal that is indicative of process variations within the controller integrated circuit, wherein the logic circuitry is connected to receive the second signal further trims the value of the control signal in response thereto.

23. The method of claim 22, wherein process detector circuit includes a ring oscillator circuit.

24. The method of claim 13, wherein the controller integrated circuit is part of a non-volatile memory system further including a memory circuit, wherein the memory circuit is a monolithic three-dimensional semiconductor memory device where the memory cells are arranged in multiple physical levels above a silicon substrate and comprise a charge storage medium and the bit lines run in a horizontal direction relative to the substrate.

* * * * *